United States Patent
Lous et al.

(10) Patent No.: US 6,797,615 B1
(45) Date of Patent: Sep. 28, 2004

(54) METHOD OF MANUFACTURING A SEMICONDUCTOR DEVICE

(75) Inventors: Erik Jan Lous, Nijmegen (NL); Albertus Theodorus Maria Van De Goor, Nijmegen (NL); Anco Heringa, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/135,335

(22) Filed: Apr. 30, 2002

(30) Foreign Application Priority Data

May 1, 2001 (EP) .......................................... 01201579

(51) Int. Cl.⁷ .............................................. H01L 21/44
(52) U.S. Cl. ........................................................ 438/666
(58) Field of Search ............................. 438/60, 61, 75, 438/630, 631–640, 692, 622, 666

(56) References Cited

U.S. PATENT DOCUMENTS

| 4,653,176 A | * | 3/1987 | Van Ommen | 438/385 |
| 4,984,055 A | * | 1/1991 | Okumura et al. | 257/644 |
| 5,346,844 A | * | 9/1994 | Cho et al. | 438/253 |
| 6,054,336 A | * | 4/2000 | Peek et al. | 438/60 |
| 6,187,672 B1 | * | 2/2001 | Zhao et al. | 438/639 |
| 6,350,672 B1 | * | 2/2002 | Sun | 438/619 |

FOREIGN PATENT DOCUMENTS

| EP | 0704893 A2 | 3/1996 |
| WO | WO9900838 | 1/1999 |

* cited by examiner

*Primary Examiner*—Evan Pert
*Assistant Examiner*—Lisa Kilday
(74) *Attorney, Agent, or Firm*—Peter Fawilski

(57) ABSTRACT

A method of manufacturing a semiconductor device, in which a surface (1) of a semiconductor body (2) is provided with a first metallization layer comprising conductor tracks (3, 4), among which a number having a width w an a number having a greater width. On this structure an insulating layer (5) is deposited by means of a process in which the thickness of the formed insulating layer (5) is dependent on the width of the subjacent conductor tracks (3, 4), after which a capping layer (6) is deposited on the insulating layer (5). Then the silicon oxide layer is planarized by means of a polishing process. In this method, the conductor tracks having a width greater than w are split up into a number of parallel strips (10) having a width w, which strips are locally connected to one another.

7 Claims, 3 Drawing Sheets

METHOD OF MANUFACTURING A SEMICONDUCTOR DEVICE

Figure 1:
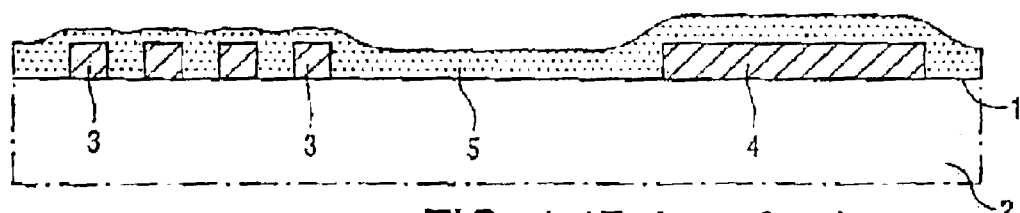

The invention relates to a method of manufacturing a semiconductor device by which method a first wiring layer with conductor tracks, among which a number having a width w and a number having a greater width, is formed on a surface of a semiconductor body, after which a first insulating layer is formed on and between the conductor tracks of the first wiring layer by means of a process in which the thickness of the insulating layer formed is dependent on the width of the subjacent conductor tracks, whereupon a capping layer is deposited on the first insulating layer and said capping layer is planarized by means of a polishing treatment. A semiconductor device is formed in this manner.

A method of the kind mentioned in the opening paragraph is known from WO 99/00838, in which the first wiring layer is formed in a layer of polycrystalline silicon. The conductor tracks form, inter alia, gate electrodes of memory and switching transistors.

It is found that a layer is formed which is not equally thick everywhere in the formation of the first insulating layer by means of, for example, a spin-on process. A thinner layer of insulating material is formed on the conductor tracks having a width w, which are present at the areas of the circuits mentioned above, than on the conductor tracks having a greater width, which are present between the circuits mentioned above. This same effect is found to occur in some cases, also if a CVD process is used for forming the first insulating layer. The capping layer deposited on the layer of insulating material has the same thickness everywhere if it is deposited by means of, for example, a CVD process. The capping layer is planarized in the polishing treatment; the layer here is given a planar surface which is parallel to the surface of the semiconductor body. The polishing treatment is continued until a desired thickness has been reached above the conductor tracks having the width w, for example a thickness which renders it possible to form a second wiring layer on the capping layer and which is so small that a capacitive coupling between the two wiring layers is a minimum. Since the thickness of the insulating layer above the wide conductor tracks is greater than above the conductor tracks having the width w, a capping layer will remain above the wider conductor tracks in the polishing treatment which is thinner than the capping layer above the narrower conductor tracks having the width w. If the desired thickness is to be realized above the narrower conductor tracks, the layer above the wider tracks may become so thin that cracks are locally formed there in the capping layer during the polishing treatment; the layer cannot withstand the pressure exerted on the layer during polishing.

The invention has for its object inter alia to solve this problem. According to the invention, the method is for this purpose characterized in that the conductor tracks of the first wiring layer having a width greater than w are formed by a number of mutually parallel strips having a width w, which strips are locally interconnected. It is achieved thereby that the insulating layer is given a thickness, for example during a spin-on process, which is practically the same as the thickness of the layer above the narrower conductor tracks having the width w. It is found in practice then that a capping layer remains in both locations which can withstand the pressure during the polishing treatment.

Open spaces may occur between the conductor tracks with the width w and the wider conductor tracks formed by a number of mutually interconnected strips with the width w. An insulating layer is formed above these open spaces during the spin-on process with a thickness which is greater than that of the layer above the conductor tracks. The upper side of the layer, however, lies closer to the surface of the semiconductor body there than at the areas of the conductor tracks. A capping layer will remain above said open spaces after the polishing treatment which is thicker than the capping layer remaining above the conductor tracks. Cracks may arise in the capping layer also above the open spaces owing to the pressure exerted on the layer during the polishing treatment. The capping layer will then show cracks mainly in those regions where the thickness transition takes place. This problem is solved if plates are formed in the first wiring layer of conducting material provided on the surface between neighboring conductor tracks of the first wiring layer, that are separated by a space having a width larger than w said plates being formed by a number of mutually parallel strips having a width w. The insulating layer above these plates will then have a thickness equal to the thickness of the layer above the conductor tracks. Alternatively, the isolated plates may be formed in a separate layer of insulting material. Preferably all spaces with a width larger than twice the width w are filled up. The spaces are for instance filled with tracks of the same pattern and size as the other conducting tracks.

It is achieved that the insulating layer has the same thickness everywhere and that a capping layer of uniform thickness is formed in the polishing treatment over the entire surface area of the semiconductor body in that it is ensured that the conductor tracks of the first metallization layer having a width w as well as the mutually parallel strips forming the wider conductor tracks and the plates are formed with a mutual distance w each time. Cracks in this layer arising during the polishing treatment are counteracted as much as possible thereby.

Further process steps may take place after the planarization of the capping layer. The planarized capping layer may be provided with contact windows within which conductor tracks of the first wiring layer are exposed, whereupon the planarized capping layer is provided with a second wiring layer with conductor tracks which make contact with conductor tracks of the first wiring layer. An additional advantage of this is that the conductor tracks of the second wiring layer may at the same time serve as interconnections for the mutually parallel strips having a width w which form the conductor tracks of the first wiring layer. An interconnection of said strips in the first wiring layer is made unnecessary thereby.

Figure 8:
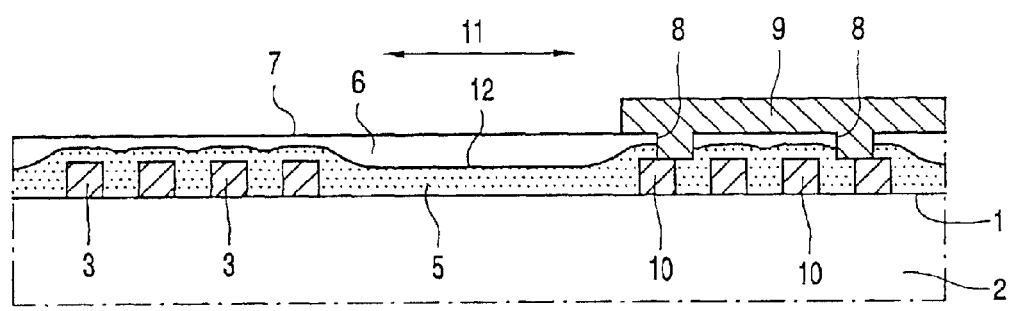
Figure 9:
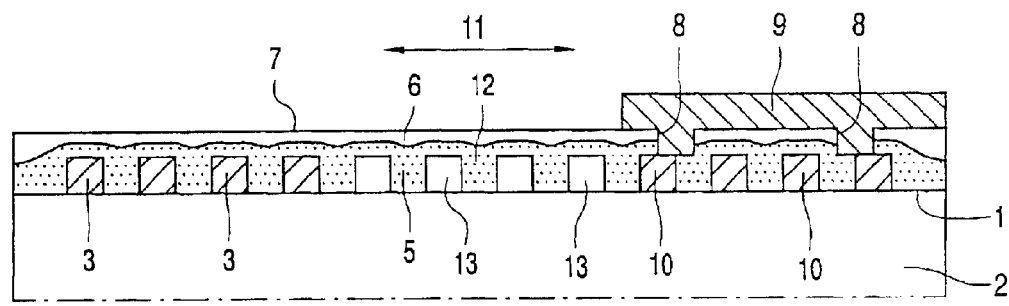

The invention will be explained in more detail below by way of example with reference to a drawing, in which:

FIGS. 1 to 4 diagrammatically and in cross-section show a few stages in the manufacture of a semiconductor device, demonstrating the problems to which the invention offers a solution, FIGS. 5 to 8 diagrammatically and in cross-section show a few stages in the manufacture of a semiconductor device by the method according to the invention, and FIG. 9 diagrammatically and in cross-section shows a special embodiment of the method shown in FIGS. 5 to 8.

FIGS. 1 to 4 diagrammatically and in cross-section show a few stages in the manufacture of a semiconductor device, where a first wiring layer of conductor tracks 3, 4 is formed on a surface 1 of a semiconductor body 2. This first wiring layer may be formed in a layer of polycrystalline silicon and may comprise, for example, gate electrodes of MOS transistors. The first wiring layer may alternatively be formed in a layer of tungsten which is deposited on a layer of silicon oxide provided with contact windows through which conductor tracks can make contact with semiconductor zones formed in the semiconductor body. This choice is not relevant to the invention. It is not indicated in the Figures what is present below the first wiring layer for the sake of simplicity. It is assumed here by way of example that there is a wiring layer formed in an approximately 500 nm thick layer of a usual aluminum-copper alloy deposited on a layer of silicon oxide in a "0.18 μm process". Smallest details with dimensions of 0.18 μm can be realized in such a photolithographic process. MOS transistors with gale lengths of this dimension are formed thereby, and the narrowest conductor tracks 3 of the first wiring layer will have a width w of 0.32 μm in this case.

The semiconductor device comprises a number of circuits, such as microprocessors, memories which can contain data necessary for the operation of the microprocessors, memories for temporary storage of data to be processed, and circuits for the input and output of data. These circuits comprise a large number of transistors which are interconnected by the very narrow conductor tracks 3 of the first wiring layer, while the circuits themselves are interconnected by wider conductor tracks 4 of this wiring layer. The narrow conductor tracks 3 here have a width w of 0.32 μm, the wider ones a width of 5 μm. All conductor tracks have a thickness of approximately 500 nm.

As is shown in FIG. 1, a first insulating layer 5 is subsequently provided on and between the conductor tracks 3, 4 by means of, for example, a usual spin-on process. This may be, for example, a layer of a polymeric material such as methyl polysiloxane, which is cured after its deposition in a heat treatment at a temperature of approximately 400° C. The conductor tracks 3, 4 are insulated from one another by this material. Methylpolysiloxane has a comparatively low dielectric constant of approximately 3.2, so that the very narrow conductor tracks have a much smaller capacitive coupling to one another than if these conductor tracks were insulated from another, for example, by means of silicon oxide, which has a dielectric constant of 4.1. Alternatively, the first insulating layer may be a layer of, for example, HSQ (hydrogen silsesquioxane).

Figure 2:
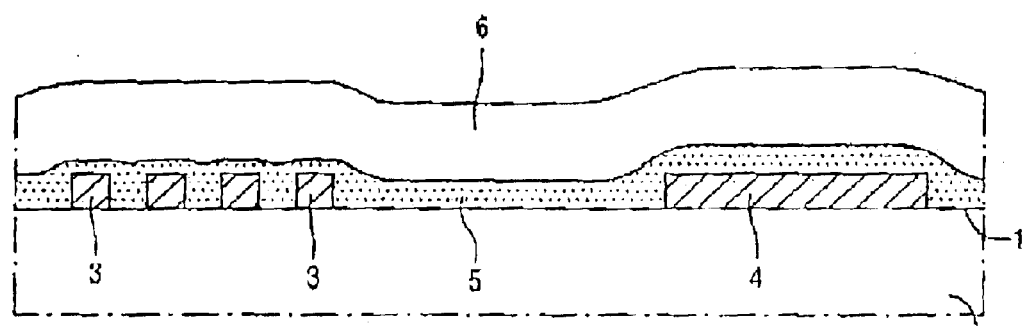

As is shown in FIG. 2, the first insulating layer 5 is covered with an approximately 1 μm thick capping layer 6 which is deposited, for example, in a CVD (chemical vapor deposition) process. This capping layer may comprise, for example, silicon oxide and has a greater density than the subjacent first insulating layer. Said CVD process may be carried out in a plasma, in which case a dense layer of silicon oxide can be deposited from a gas mixture comprising silane and oxygen at a temperature of 400° C.

Figure 3:
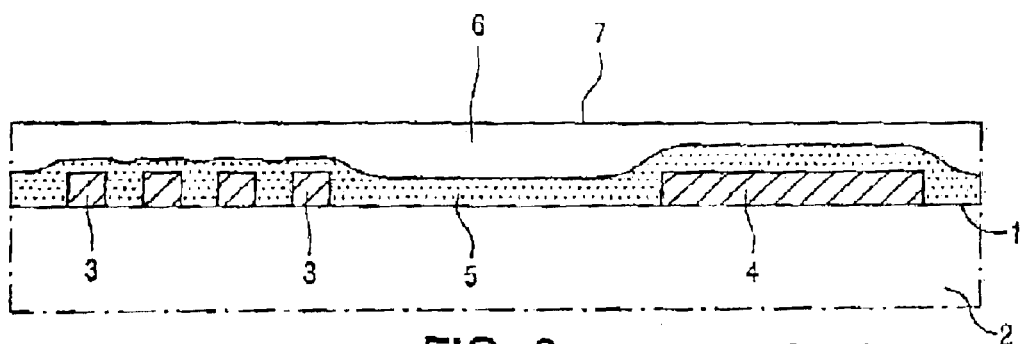
Figure 4:
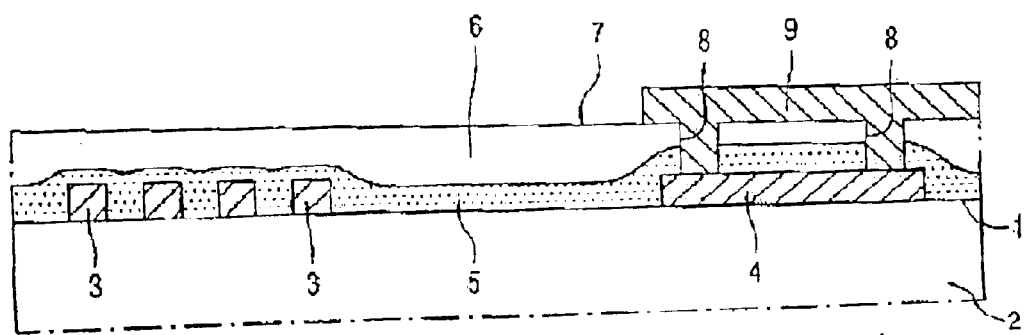

As is shown in FIG. 3, the layer of silicon oxide 6 is planarized in a polishing treatment, for example a chemical-mechanical polishing treatment. Then, if necessary, see FIG. 4, the planarized layer of silicon oxide 6 and the subjacent layer of polymeric material 5 may be provided with contact windows 8 within which conductor tracks 4 of the first wiring layer are exposed, whereupon the planarized layer of silicon oxide 6 is provided with a second wiring layer with conductor tracks 9 which make contact with conductor tracks of the first wiring layer. The drawing only shows contact windows to a conductor track 4 for the sake of simplicity, but it will be obvious that further contact holes are present outside the plane of drawing.

An intermediate dielectric 5, 6 is thus formed between the two wiring layers 3, 4 and 9, which dielectric consists of a first insulating layer 5 with a layer of silicon oxide 6 disposed thereon. To realize a capacitive coupling which is as small as possible between the wiring layers, an intermediate dielectric must be formed with a comparatively thick first insulating layer and as thin as possible a layer of silicon oxide. The layer of silicon oxide must accordingly be polished so as to become extremely thin during the chemical-mechanical polishing treatment.

The formation of the first insulating layer 5 does not take place to the same thickness everywhere. As is shown in FIG. 1, a thinner layer is formed on the narrow conductor tracks 3 than on the wider conductor tracks 4; the first insulating layer 5 in this example will have a thickness of approximately 250 nm above the narrow conductor tracks after the heat treatment and a thickness of approximately 550 nm above the wide conductor tracks 4. The layer of silicon oxide 6 has the same thickness everywhere after deposition, as is shown in FIG. 2. The layer of silicon oxide is planarized in the chemical-mechanical polishing treatment; the layer is given a planar surface 7 here which extends parallel to the surface 1 of the semiconductor body 2. The polishing treatment is continued until the layer of silicon oxide has a thickness of approximately 450 nm above the conductor tracks having the width w. This thickness renders it possible to form the second wiring layer on the layer 6 and is so small that a capacitive coupling between the two wiring layers is weak. Since the thickness of the first insulating layer 5 above the wide conductor tracks 4 is greater than above the narrow conductor tracks 3, the chemical-mechanical polishing treatment will result in a layer of silicon oxide of approximately 300 nm thickness above the wider conductor tracks, i.e. thinner than the layer of silicon oxide above the narrower conductor tracks having the width w. This latter layer is so thin then that cracks may arise therein during the polishing treatments; the layer is unable to withstand the pressure exerted on the layer during polishing.

Figure 5:
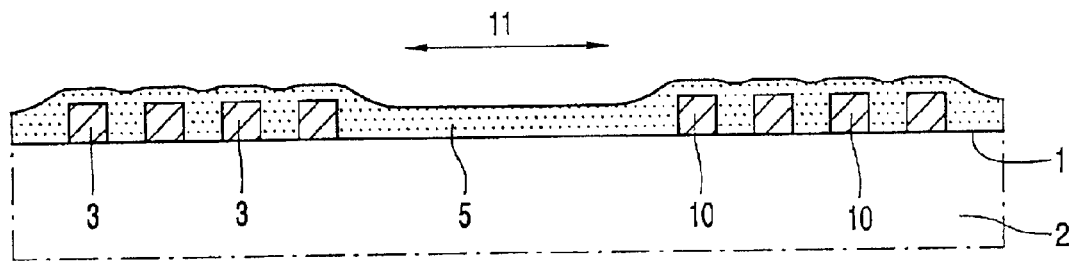
Figure 6:
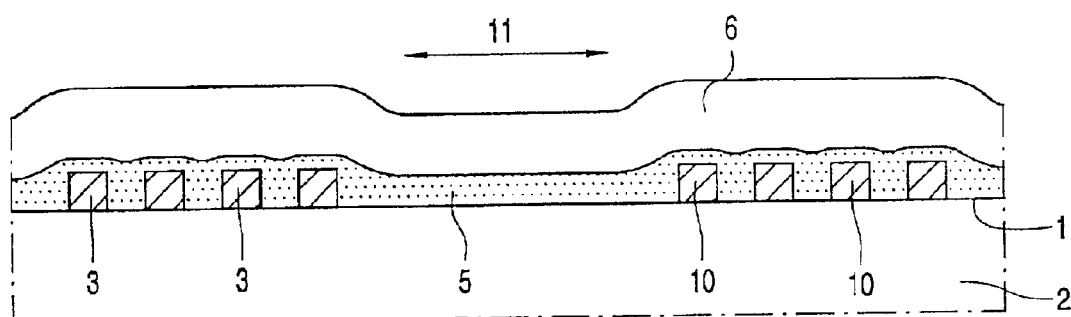
Figure 7:
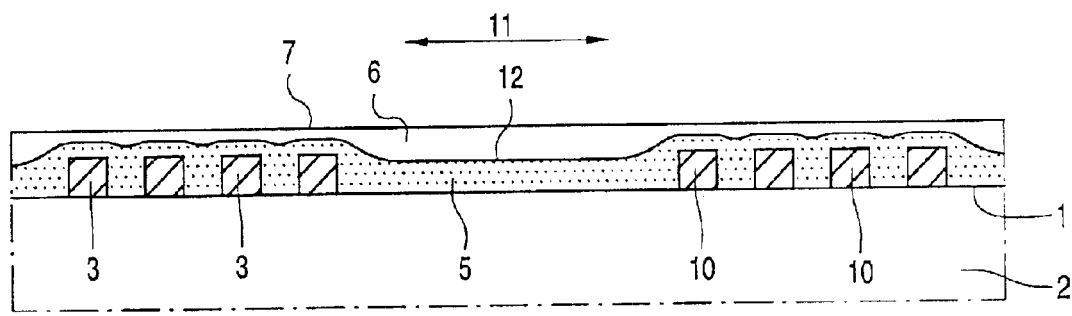

FIGS. 5 to 8 diagrammatically show the same steps as in the method shown in FIGS. 1 to 4, but now the semiconductor device is manufactured by a method in which measures are taken for solving the problem discussed above. The conductor tracks 4 of the first wiring layer having a width greater than w shown in FIG. 1 are now formed, as shown in FIG. 5, by a number of mutually parallel strips 10 with a width w which are locally interconnected. It is achieved thereby that the first insulating layer 5, cf. FIG. 5, is given a thickness in the spin-on process which is practically the same everywhere and is approximately 250 nm. After the layer of silicon oxide 6 has been deposited, the chemical-mechanical polishing treatment is carried out such that the layer of silicon oxide 6 is polished until the moment it has a thickness of approximately 450 nm above the conductor tracks 3 and above the strips 10. This layer 6 is capable of withstanding the pressure exerted in the chemical-mechanical polishing treatment. Contact windows 8 are formed in the intermediate dielectric 5, 6, and then a second wiring layer with conductor tracks 9 is formed on the layer of silicon oxide 7.

As is shown in FIGS. 5 to 8, open spaces 11 may be present between the narrow conductor tracks 3 and the wide conductor tracks formed by a number of interconnected strips 10. A first insulating layer 5 is formed in these open spaces 11 in the spin-on process with a thickness which is approximately 500 nm greater than that of the layer above the conductor tracks 3 and the strips 10. The upper side 12 of the layer 5, however, lies closer to the surface 1 of the semiconductor body 2 here than at the areas of the conductor tracks 3 and the strips 10. As FIG. 8 shows, a layer of silicon oxide 6 remains above said open spaces 11 after the chemical-mechanical polishing treatment, which layer is approximately 700 nm thick, i.e. thicker than the layer of silicon oxide remaining above the conductor tracks 3 and the strips 10. Cracks may arise in the layer of silicon oxide 6 above the open spaces 11 owing to the pressure exerted on the layer during the polishing treatment. The layer of silicon oxide 6 will then show cracks mainly in the regions where the thickness transition takes place. This problem is solved if plates are formed in the first layer of conductive material provided on the surface, as shown in FIG. 9, which plates fill up the spaces between the conductor tracks of the first metallization, said plates being formed by a number of mutually parallel strips 13 having a width w. The first insulating layer 5 above these plates will then have a thickness which is equal to the thickness of the layer 5 above the conductor tracks 3 and the strips 10.

It is achieved that the first insulating layer has the same thickness everywhere and that a layer of silicon oxide is formed which has the same thickness over the entire surface area of the semiconductor body in that it is ensured that the conductor tracks 3 of the first wiring layer having a width w as well as the mutually parallel strips 10 forming the wider conductor tracks and the strips 13 forming the plates are provided with mutual interspacings equal to w. Cracks occurring in the silicon oxide layer during the polishing treatment are counteracted thereby as much as possible.

The field of application of the method according to the invention is not limited to the embodiments discussed above. The method according to the invention may be used inter alia in the case of air gaps serving as an insulation between the various conductor tracks.

What is claimed is:

1. A method of manufacturing a semiconductor device, by which method a first wiring layer with conductor tracks is formed on a surface of a semiconductor body, wherein a number of the conductor tracks have a width w and a number of the conductor tracks have a width greater than w, wherein plates are formed in the first wiring layer provided on the surface between neighboring conductor tracks that are separated through a space having a width larger than w, said plates being formed by a number of mutually parallel strips having a width w, after which a first insulating layer is formed on and between the conductor tracks of the first wiring layer by means of a process in which the thickness of the insulating layerformed is dependent on the width of the subjacent conductor tracks, whereupon a capping layer is deposited on the first insulating layer and said capping layer is planarized by means of a polishing treatment, characterized in that the conductor tracks of the first wiring layer having a width greater than w are formed by a number of mutually parallel strips having a width w, which strips are locally interconnected.

2. A method as claimed in claim 1, characterized in that both the conductor tracks having a width w and the mutually parallel strips forming the wider conductor tracks and the plates are provided with mutual interspacings equal to w.

3. A method as claimed in claim 1, characterized in that the planarized capping layer is provided with contact windows within which the conductor tracks of the first wiring layer are exposed, whereupon the planarized capping layer is provided with a second wiring layer with conductor tracks which make contact with the conductor tacks of the first wiring layer.

4. A method as claimed in claim 1, characterized in that the first insulating layer is formed by means of a spin-on process.

5. A method as claimed in claim 1, characterized in that the capping layer comprises silicon oxide.

6. A method as claimed in claim 1, characterized in that the capping layer is deposited in a CVD process.

7. A method as claimed in claim 1, characterized in that the polishing treatment used is a chemical-mechanical polishing treatment.

* * * * *